United States Patent
Chan et al.

(10) Patent No.: US 6,579,614 B2
(45) Date of Patent: Jun. 17, 2003

(54) STRUCTURE HAVING REFRACTORY METAL FILM ON A SUBSTRATE

(75) Inventors: Kevin K. Chan, Staten Island, NY (US); Erin C. Jones, Tuckahoe, NY (US); Fenton R. McFeely, Ossining, NY (US); Paul M. Solomon, Yorktown Heights, NY (US); John J. Yurkas, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/814,766

(22) Filed: Mar. 23, 2001

(65) Prior Publication Data

US 2001/0019737 A1 Sep. 6, 2001

Related U.S. Application Data

(62) Division of application No. 09/337,550, filed on Jun. 22, 1999, now Pat. No. 6,238,737.

(51) Int. Cl.[7] .................................................. B32B 9/00
(52) U.S. Cl. ....................... 428/336; 428/446; 428/472; 428/698; 428/701
(58) Field of Search ................................. 725/472, 446, 725/698, 701; 428/336

(56) References Cited

U.S. PATENT DOCUMENTS

| | | | |
|---|---|---|---|
| 4,579,752 A | | 4/1986 | Dubois et al. |
| 4,701,349 A | | 10/1987 | Koyanagi et al. |
| 4,772,571 A | * | 9/1988 | Scovell et al. ............... 437/200 |
| 4,855,798 A | * | 8/1989 | Imamura et al. ............... 357/71 |
| 5,629,043 A | | 5/1997 | Inaba et al. |
| 5,652,180 A | * | 7/1997 | Shinriki et al. ............. 437/190 |
| 5,770,520 A | * | 6/1998 | Zhao et al. |
| 5,834,846 A | * | 11/1998 | Shinriki et al. ............. 257/754 |
| 5,903,053 A | * | 5/1999 | Iijima et al. |
| 5,907,188 A | * | 5/1999 | Nakajima et al. |
| 5,977,581 A | * | 11/1999 | Thakur et al. ............... 257/310 |
| 5,994,183 A | | 11/1999 | Huang et al. |
| 6,025,632 A | * | 2/2000 | Fukuda et al. |
| 6,130,124 A | * | 10/2000 | Lee |
| 6,178,082 B1 | * | 1/2001 | Farooq et al. |

FOREIGN PATENT DOCUMENTS

JP 06-124915 5/1994

OTHER PUBLICATIONS

Wang et al., Journal of the Electrochemical Society, vol. 146, No. 2, pp728–734, Feb., 1999.

* cited by examiner

Primary Examiner—Archene Turner
(74) Attorney, Agent, or Firm—Wen Y. Cheung, Esq.; McGinn & Gibb, PLLC

(57) ABSTRACT

A method of treating structures (and the structure formed thereby), so as to prevent or retard the oxidation of a metal film, and/or prevent its delamination a substrate, includes providing a structure including a refractory metal film formed on a substrate, placing the structure into a vessel having a base pressure below approximately $10^{-7}$ torr, exposing the structure to a silane gas at a sufficiently high predetermined temperature and predetermined pressure to cause formation of a metal silicide layer on the refractory metal film, and exposing the structure to a second gas at a sufficiently high temperature and pressure to nitride the metal silicide layer into a nitrided layer.

15 Claims, 2 Drawing Sheets

US 6,579,614 B2

STRUCTURE HAVING REFRACTORY METAL FILM ON A SUBSTRATE

The present application is a Divisional application of U.S. patent application Ser. No. 09/337,550, filed on Jun. 22, 1999 now U.S. Pat No. 6,278,737.

STATEMENT REGARDING FEDERALLY SPONSORED RESEARCH OR DEVELOPMENT

The subject matter of the present application was funded at least partially by DARPA grant No. N66001-97-1-8908.

BACKGROUND OF THE INVENTION

1. Field of the Invention

The present invention generally relates to a method and apparatus for preserving the integrity of thin refractory metal films when the films are subjected to a predetermined high temperature in an oxidizing atmosphere.

More particularly, the present invention relates to preventing oxidation of the metal film and to preventing the metal film from delaminating from the substrate onto which it has been deposited.

2. Description of the Related Art

With their high conductivity, their high melting points, and the values exhibited by their work functions, refractory metals are attractive materials for incorporation into semiconductor devices. For example, tungsten is potentially an attractive material from which to fabricate the gate electrodes of field effect transistors (FETs). To form such structures, the refractory metal films can be deposited onto the semiconductor substrate, typically comprising a silicon dioxide layer on a silicon substrate, by any of a plurality of methods. The refractory metal can also be incorporated into the structure by, for example, wafer-bonding techniques.

However, a problem arises when the refractory metal, already incorporated into the device structure, must be subjected to an oxidizing atmosphere at a relatively high temperature (e.g., greater than about 300° C. to about 700° C. depending upon the structure being built and the specific processes involved). For example, as shown in FIGS. 1A–1B, steps in the fabrication of a structure are illustrated in which the refractory metal (e.g., tungsten) is to be employed as the back gate of a double-gated FET device. By a combination of steps, involving W deposition and subsequent wafer bonding, a structure such as that illustrated schematically in FIG. 1A can be fabricated.

In FIG. 1A, first a silicon wafer substrate formed of an oxide layer 2 on a silicon substrate is provided. Thus, the wafer substrate is a thick insulating oxide layer. Further, a tungsten layer 3 is provided on the oxide layer 2. The tungsten layer 3 forms the back gate electrode in the finished structure. A back gate oxide 4 having a thickness of approximately 5.0 nm, is applied over the tungsten layer. Additionally, silicon layer 5 is provided on the oxide layer 4. The silicon layer 5 forms the channel of the FET in the finished device.

Thereafter, the next step is to form the top gate oxide 6, as shown (not to scale) in FIG. 1B. To grow this oxide 6, a preferred procedure is to place the wafer in a reactor at a temperature of approximately 700° C. in 1 atmosphere of pure oxygen for a period of about 5–10 minutes or longer.

However, when the processing steps depicted in FIG. 1A are attempted and a high temperature processing in an oxidizing atmosphere are performed, the tungsten layer 3 may become delaminated from the insulating oxide 2 (e.g., at interface A shown in FIG. 1B), thereby destroying the structure and its utility. Even at lower temperatures (e.g., about 300° C.), in attempting to perform oxidation in pure oxygen or depositing oxides from silane-oxygen mixtures, deleterious effects have been observed.

To validate that this behavior is the result of the inherent instability of interface A at high temperature in oxidizing ambients, and not to any of the details in the processing necessary to form the structure in FIG. 1A, experiments were performed on the simplified structure 20 shown in FIG. 2A.

The structure of FIG. 2A is simply a blanket film of tungsten 23 deposited on $SiO_2$ 22 thermally grown on a silicon substrate 21. The tungsten 23 was deposited by chemical vapor deposition (CVD) from W(CO)6 to a thickness within a range of about 100 Å to about 1000 Å. Such films may be heated to about 1000° C. in an inert atmosphere (e.g., Argon or moderate vacuums with pressure less than about $10^{-4}$ torr) in a rapid thermal annealing system without apparent degradation. However, heating these structures in an oxidizing ambient (1 atmosphere of pure oxygen) caused the metal film to visibly oxide and/or delaminate at temperatures as low as about 300° C.

Moreover, no film was ever observed to withstand the time/temperature combination required to grow the top gate oxide 6 of FIG. 1B. Therefore, without a new method to stabilize interface A, the structure of FIG. 1B cannot be fabricated. That is, the refractory metal film will delaminate at the interface, or at the very least the refractory metal (e.g., tungsten or the like) may still hold, but be oxidized, thereby causing stability or performance problems of the device.

SUMMARY OF THE INVENTION

In view of the foregoing and other problems of the conventional methods and structures, an object of the present invention is to provide a method and structure which facilitates high temperature processing which retards oxidation and prevents delamination of metals.

In a first aspect of the present invention, a method of treating structures, so as to at least one of prevent or retard oxidation of a metal film, and its delamination from a substrate, includes providing a structure including a refractory metal film formed on a substrate, placing the structure into a vessel having a base pressure below approximately $10^{-7}$ torr, exposing the structure to a silane gas (e.g., where a silane is any compound of composition $Si_nH_{2n+2}$ or a gas where one or more of the hydrogen atoms are replaced by an organic substituent) at a sufficiently high predetermined temperature and predetermined pressure to cause formation of a metal silicide layer on the refractory metal film, and exposing the structure to a gas (e.g., comprising a reactive nitrogen (e.g., $NH_3$)) at a sufficiently high temperature and pressure to nitride the metal silicide layer into a nitrided layer. Typical conditions for $NH_3$ are 700° C., 1 mtorr and 5 minutes.

In a second aspect, a structure is provided which includes a refractory metal film formed on a substrate. A metal silicide layer is formed on the refractory metal film by placing the structure into a vessel having a base pressure below approximately $10^{-7}$ torr, and exposing the structure to a silane gas at a sufficiently high predetermined temperature and predetermined pressure to cause formation of a metal silicide layer on the refractory metal film. The metal silicide layer is nitrided to form a nitrided layer.

With the unique and unobvious method and structure of the invention, a structure can be produced in which a refractory metal film can withstand the time/temperature combination required to grow, for example, a top gate oxide of an FET as shown in FIG. 1B.

That is, a new method is provided for stabilizing interface A, and therefore a structure as in FIG. 1B can be reliably formed.

Additionally, the refractory metal film forms a diffusion barrier to oxygen, and can be used in any instance where the barrier is desired.

BRIEF DESCRIPTION OF THE DRAWINGS

The foregoing and other purposes, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 2:
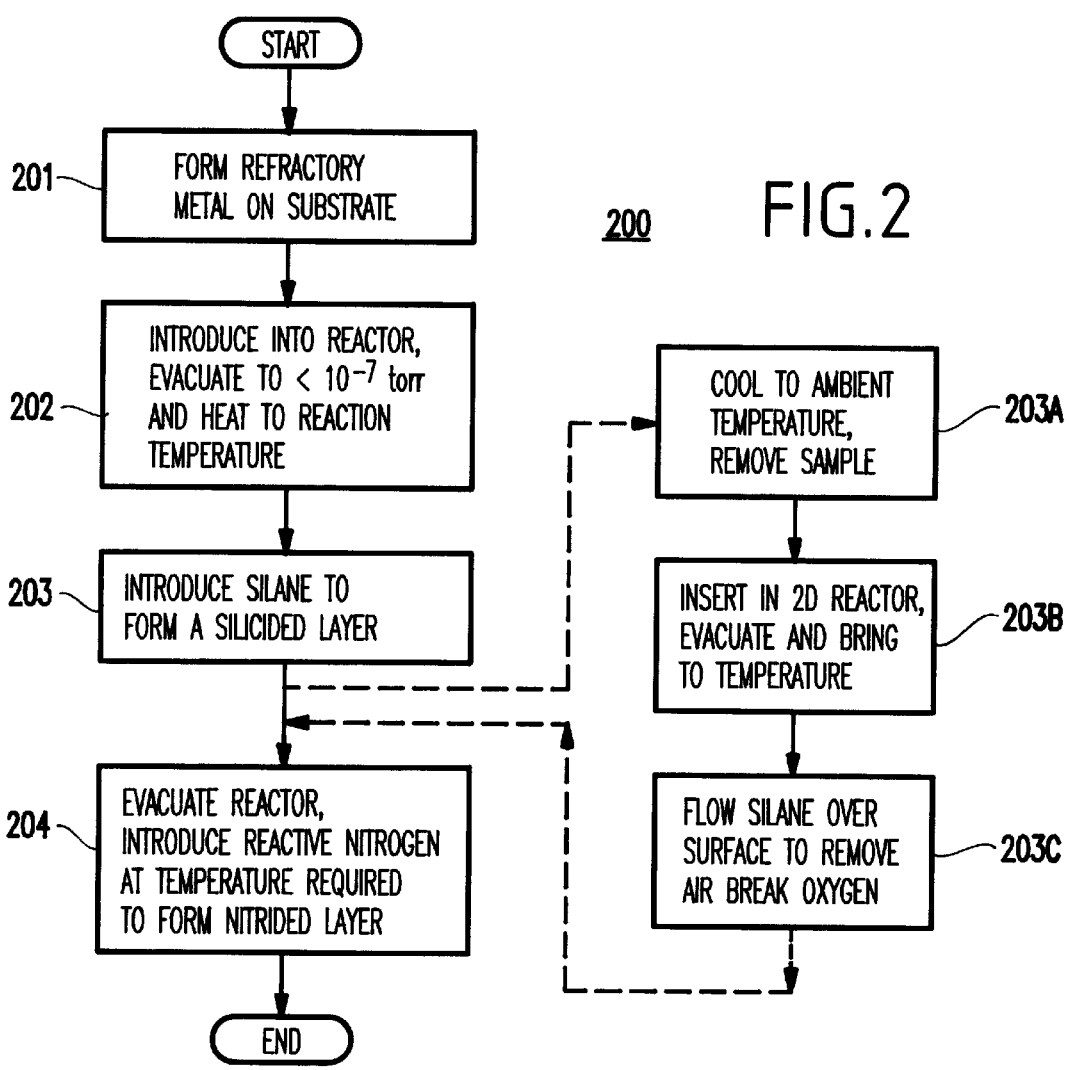
FIG. 2 illustrates a flowchart according to the present invention.
Figure 3A:
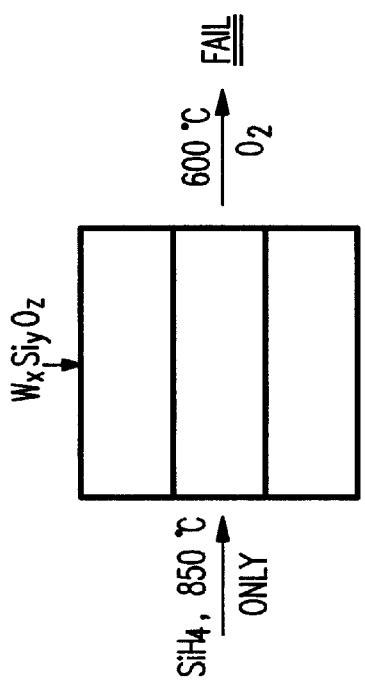
FIG. 3A illustrates an exemplary simplified structure for processing by the present invention.
Figure 3B:
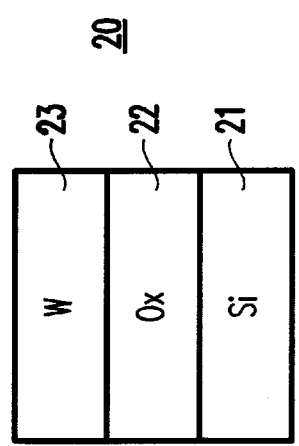
FIG. 3B illustrates a first processing according to the invention.
Figure 3C:
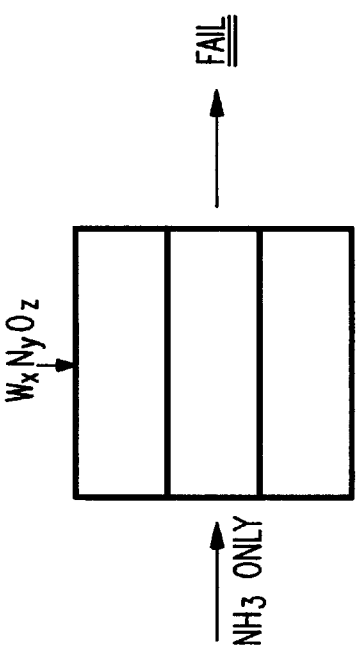
FIG. 3C illustrates a second processing according to the conventional technique.
Figure 3D:
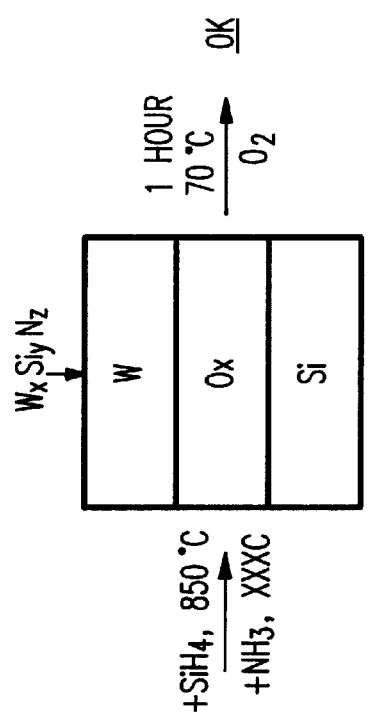
FIG. 3D illustrates a third processing according to a second conventional technique.

Referring now to the drawings, and more particularly to FIGS. 2–3D, there are shown preferred embodiments of the method and structures according to the present invention.

Generally, a primary application envisioned for the present invention is in the fabrication of semiconductor devices in which films comprising refractory metal are present as one or more components of the devices. Examples of such components are gate electrodes for field effect transistors (FETs) or capacitors, ground or backplanes for FETs, contacts, on-chip wires and the like.

Hereinbelow, the invention will be discussed with specific reference to applications in the exemplary semiconductor device field.

However, the invention applies quite generally to any instance in which it is necessary to subject a thin film (e.g., having a thickness of substantially between about 1 $\mu$m or less, comprising a refractory metal to high temperatures (e.g., temperatures above about 600° C.) in an oxidizing atmosphere while avoiding oxidation and/or delamination of the film from its substrate.

Referring to FIG. 2, a flowchart of a method 200 according to the present invention is shown. Generally, the method of the invention described below comprises a two step method to chemically treat refractory metal-semiconductor structures, such as those exemplarily shown in FIGS. 1A–1B or FIGS. 3A–3D, or any similar structure.

Following this treatment, the structure can be heated to about 700° C. in an oxidizing atmosphere without delamination of the structure at interface A.

In the method 200, first in step 201, a refractory metal film is formed on a substrate (e.g., a semiconductor or insulator).

In step 202, the pressure around the structure (e.g., refractory metal film on the substrate) is reduced to below approximately $10^{(-7)}$ torr. It is preferable to have as low a pressure as possible (e.g., in a range of about $10^{(-7)}$ to about $10^{(-9)}$ torr in order that the sample not be oxidized. This facilitates the reaction of the silicon from the silane with the metal, not with any oxygen.

In step 203, a metal silicide layer is formed on the refractory metal film by exposing the structure to a silane gas (e.g., where a silane is any compound of composition $Si_nH_{2n+2}$ or a gas where one or more of the hydrogen atoms are replaced by an organic substituent) at a sufficiently high predetermined temperature (e.g., preferably>350° C.) and a predetermined pressure 1–10 millitorr for a predetermined time, preferably about 1 to 5 minutes), to cause the formation of the metal silicide on the refractory metal film.

Finally, in step 204, the structure is exposed to a gas (e.g., comprising a reactive nitrogen gas such as $NH_3$) at a sufficiently high temperature to effect reaction (e.g., if $NH_3$ used, a preferred temperature is greater than about 500° C., but the temperature may be as low as room temperature if nitrogen atoms such as these produced by a plasma process are employed) and pressure (e.g., preferably about 1 millitorr for $NH_3$) to nitride the metal silicide layer into a nitrided layer.

It is noted that optionally the method above could be modified to include several additional processing steps between steps 203 and 204.

Specifically, as shown in FIG. 2 by the dotted lines, steps 203A–203C could be employed. That is, in step 203A, the sample could be cooled to room temperature and then the sample could be removed from the reactor, thereby producing an "air break".

In step 203B, the sample is inserted into a second reactor similar to the first reactor. The second reactor is evacuated, and the temperature is brought to operating temperature.

In step 203C, a silane is flowed (e.g., about 1 standard cc of silane) over the surface of the sample to remove the air break oxygen produced during the air transfer.

Thereafter, the process loops to step 204 described above. Thus, this modification allows usage of two reactors, instead of just one reactor, as described above.

Thus, the invention uses a combination of steps including both forming a metal silicide layer and nitriding the metal silicide layer. A conventional technique, envisions only a silicide layer which, as shown below, is insufficient for the present invention's purposes.

The present invention was implemented and evaluated utilizing a structure such as that shown in FIG. 3A, where the exemplary refractory metal comprised tungsten, deposited as a blanket film having a thickness of approximately 100 nm thick on a layer of thermally grown $SiO_2$ layer having a thickness of approximately 90 nm, on a silicon substrate.

The deposition was effected by CVD from a W(CO)6 precursor in a manner as has been previously described.

While the exemplary implementation used an approximate 100-nm-thick tungsten film, it is noted that the refractory metal may have a thickness of below approximately 1.0 $\mu$m.

The substrate was sectioned into pieces approximately 1 cm×3 cm and placed in a hot-wall, quartz vacuum reactor chamber with a base pressure of $3 \times 10^{(-10)}$ torr, and heated to approximately 850° C. in this vacuum. Silane (e.g., $SiH_4$) gas was admitted into the reactor with a flow rate of approximately 5 standard cc/minute to a pressure of 10 mtorr, and the reaction between the substrate and the silane was allowed to proceed for approximately 5 minutes.

After approximately 5 minutes, the silane was pumped away and the substrate cooled to room temperature before removing it from the vacuum chamber (step 203A). The substrate was then introduced into a second similar reactor which was then evacuated, and the temperature brought to 700° C. (step 203B). Then, approximately one standard cc/minute of silane ($SiH_4$) was flowed across the sample surface, and the reactor was evacuated of silane (step 203C). Then, the metal silicide was the nitrided (step 204).

Thus, the process/method 200 according the present invention includes two surface treatments, a silicidation treatment followed by a nitridation step. In the event of an air break between the two steps (e.g., either steps 203–204 or steps 203A-204), a second silane treatment is employed to obviate the effects of the air break. The present inventions consider the two paths (e.g., 203–204 and 203A-204) to substantially effect the same practical results. The combination of such steps protects the metal film structure from high temperatures. However, neither treatment alone suffices to protect the metal film structure from the deleterious effects of high temperature exposure to an oxidizing atmosphere, as can bee seen from the results of the tests below.

EXAMPLES

To test the effectiveness of the invention in enabling the thin film structure to withstand high temperature processing, three different types of samples were prepared as follows.

First, approximately 100 nm of W was deposited at 450° C. via CVD from a W(CO)6 onto oxidized silicon substrates as described above. These samples were sectioned into approximately 1 cm×3 cm pieces and given the following treatments.

Some samples (e.g., a first comparative example) were given no further treatment (referred to as untreated samples).

Some samples (e.g., a second comparative example) were given the silicidation treatment only (the silicided-only samples).

Some samples (e.g., a third comparative example) were given the full treatment as described above with regard to the invention (e.g., the fully passivated samples) including a silicidation treatment followed by a nitridation treatment. It is noted that the present inventors did not deem it necessary to prepare samples subjected to the nitridation step alone, as it is their wide experience that such nitrided samples cannot withstand the necessary high temperature processing in the necessary oxidizing ambient. The test samples were subjected to various times and temperatures in an atmosphere of pure oxygen, with the following results.

Figure 1A:
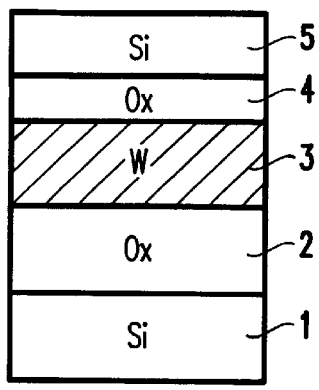
FIGS. 1A–1B illustrate an exemplary structure for a semiconductor device.
Figure 1B:
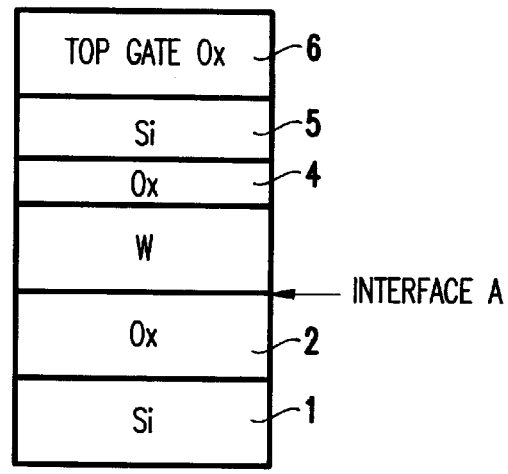

After being subjected to a temperature of approximately 700° C. for approximately 5 minutes, the untreated samples exhibited "catastrophic delamination" of the tungsten film at interface A (e.g., see FIG. 1B). For purposes of the present application, "catastrophic delamination" is defined as the refractory metal film peeling off in shards from the rest of the structure.

The silicided-only samples (e.g., the second comparative examples) showed no improvement over the untreated samples.

However, the third comparative examples (e.g., the fully passivated samples having been silicided first and then nitrided) were able to withstand exposure to an oxygen atmosphere at approximately 700° C. for a period of 60 minutes without undergoing delamination or exhibiting any other signs of degradation.

Thus, only the fully passivated films (e.g., the third comparative examples) are capable of withstanding the conditions for the growth of, for example, gate oxide shown in FIGS. 1A–1B.

Thus, the present invention is a two-step passivation process involving 1) a silicidation step followed by 2) a nitridation step, thereby resulting in the formation of a ternary nitrogen-silicon-metal surface layer which protects the metal film. Considerable variation is possible in the materials and processes used to effect these steps. One of the desirable characteristics of the invention is that exacting control of treatment times and temperatures is unnecessary, and a considerable latitude is possible in the selection of materials and reagents.

The passivation treatments discussed above would be equally effective in passivating other refractory metals, such as tantalum, niobium, and molybdenum. All of these metals would be similarly reactive to the silane in the silicidation operation, and the silicided layers formed in this operation would be similarly reactive in the nitridation step.

Thus, in each instance, the ternary nitrogen-silicon-metal passivating layer would be formed. All of the refractory metals listed above possess similar thermodynamic and kinetic properties with respect to the reagents used to effect the introduction of the silicon and the nitrogen. Essentially, identical treatments could be applied to films of all four metals, with only minimal, if any, fine-tuning of conditions (e.g., minor adjustments in pressures, times, and temperatures of treatments).

Considerable variations are also possible in performing the silicidation step. A vacuum deposition chamber is the preferred reactor for performing this step. Such a chamber preferably has a base pressure of less than about $1\times10^{(-7)}$ torr, and preferably less than $1\times10^{(-9)}$ torr). However, an atmospheric pressure reactor could be used, provided that the partial pressure of oxygen in such a reactor were less than or equal to that provided by the specified vacuum reactor.

As described in the exemplary embodiment above, silane (e.g., $SiH_4$) was used to react with the substrate. However, any of the higher silanes (e.g., molecules of the composition $SinH_{2n+2}$) could be employed with little, if any change in reaction conditions. Substituted silanes also could be employed.

A reaction temperature of about 850° C. and silane pressure of about 10 mtorr were specified above in the exemplary embodiment. Such conditions are preferred in order to minimize processing time. However, the metal films should be sufficiently reactive at any temperature in excess of 350° C., provided that the processing time could be increased. Similarly, the silane pressure could be reduced, again at the cost of increased processing time. It is estimated that a pressure of about 0.01 mtorr would be a practical lower limit.

Further, the above parameters regarding the nitridation step can be suitably changed. For example, the purpose of the nitridation step is to introduce nitrogen into the metal-silicon layer formed in step 1. Similar latitude exists in performing this step. Ammonia was specified as the reagent in the exemplary embodiment above. Ammonia can be employed at any temperature exceeding about 350° C. (e.g., 500° C. preferred). However, any molecule including reactive nitrogen could also be used, such as hydrazine, or an organic amine, with appropriate adjustment in reaction temperature. Very low temperatures could be employed in the nitridation step by the use of a plasma assisted process to react the nitrogen with the substrate. These methods are well-known to those of ordinary skill in the art, and for brevity will not be further described herein.

Further, the entire process may be performed in a single reactor, such as was the silicidation step described above, by a simple switching or reactant gasses.

Thus, with the invention, a structure can be produced in which a refractory metal film can withstand the time/temperature combination required to grow, for example, a top gate oxide of an FET as shown in FIG. 1B. That is, with the invention, the interface A can be stabilized, such that a semiconductor device, as shown in FIG. 1B, can be reliably formed. With the invention, a refractory metal film is prevented from oxidizing and/or delaminating from an underlying substrate.

While the invention has been described in terms of several preferred embodiments, those skilled in the art will recognize that the invention can be practiced with modification within the spirit and scope of the appended claims.

For example, while the invention has been described with specific reference to applications in the exemplary semiconductor device field, the invention applies quite generally to any instance or structure in which it is necessary to subject a thin film comprising a refractory metal to high temperatures in an oxidizing atmosphere while avoiding excessive oxidation and/or delamination of the film from its substrate.

Manifestly, the invention provides a barrier to oxygen penetration and is useful to protect the substrate or any other part of a structure therefrom.

What is claimed is:

1. A structure, comprising:
   a substrate;
   an oxide layer formed on said substrate;
   a refractory metal film formed on said oxide layer and having a thickness of 1.0 µm or less; and
   a metal silicide nitride film formed on said refractory metal film and separated from said oxide layer by said refractory metal film, for preventing a delamination at an interface between said oxide layer and said refractory metal film.

2. The structure of claim 1, wherein said metal suicide nitride film comprises a refractory metal, silicon and nitrogen.

3. The structure of claim 1, wherein said metal silicide nitride film is formed by forming a silicide layer on said refractory metal film, and nitriding said silicide layer.

4. The structure of claim 1, wherein said metal suicide nitride film prevents an oxidation of said refractory metal film.

5. The structure of claim 1, wherein said metal suicide nitride film comprises a diffusion barrier to oxygen.

6. The structure of claim 1, wherein said refractory metal film comprises tungsten.

7. The structure of claim 1, wherein said metal silicide nitride film prevents a delamination at said interface after subjecting said structure to a pure oxygen atmosphere for 1 hour, and at 700° C. for 5 minutes.

8. The structure of claim 1, wherein said refractory metal layer comprises one of tungsten, tantalum, niobium, and molybdenum.

9. A structure, comprising:
   a substrate;
   an oxide layer formed on said substrate;
   a refractory metal film formed on said oxide layer and having a thickness of about 1.0 µm or less; and
   a metal suicide nitride film formed on said refractory metal film and separated from said oxide layer by said refractory metal film.

10. The structure of claim 9, wherein said metal silicide nitride film prevents a delamination at an interface between said oxide layer and said refractory metal film.

11. The structure of claim 9, wherein said metal silicide nitride film comprises a nitrided metal silicide film.

12. The structure of claim 9, wherein said refractory metal film has a thickness of about 100 nm.

13. The structure of claim 9, wherein said refractory metal film and said metal silicide nitride film comprise a same metal.

14. The structure of claim 9, wherein said refractory metal film comprises one of tungsten, tantalum, niobium, an molybdenum.

15. The structure of claim 9, wherein said metal silicide nitride film comprises a product of a reaction between a silicide refractory metal film and silane.

* * * * *